United States Patent
Iwasaki

(10) Patent No.: US 8,238,393 B2
(45) Date of Patent: Aug. 7, 2012

(54) MULTI-BEAM LASER LIGHT-INTENSITY CONTROL CIRCUIT AND OPTICAL SCANNING APPARATUS INCLUDING THE SAME

(75) Inventor: Mitsutaka Iwasaki, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 42 days.

(21) Appl. No.: 12/838,918

(22) Filed: Jul. 19, 2010

(65) Prior Publication Data

US 2011/0026552 A1    Feb. 3, 2011

(30) Foreign Application Priority Data

Aug. 3, 2009  (JP) ................. 2009-180472

(51) Int. Cl.
*H01S 3/00* (2006.01)
(52) U.S. Cl. .................................. 372/38.01
(58) Field of Classification Search ............... 372/38.01
See application file for complete search history.

(56) References Cited

U.S. PATENT DOCUMENTS

| | | | |
|---|---|---|---|
| 7,349,579 B2 | 3/2008 | Kadowaki et al. | |
| 2002/0125416 A1* | 9/2002 | Niito | 250/234 |
| 2003/0035451 A1* | 2/2003 | Ishida et al. | 372/38.02 |
| 2004/0247185 A1 | 12/2004 | Sato et al. | |

FOREIGN PATENT DOCUMENTS

| | | |
|---|---|---|
| JP | 10-288743 | 10/1998 |
| JP | 2001-24273 | 1/2001 |
| JP | 2002-42337 | 2/2002 |
| JP | 2003-101791 | 4/2003 |
| JP | 2003-248368 | 9/2003 |
| JP | 2004-32494 | 1/2004 |
| JP | 2007-251967 | 9/2007 |
| JP | 2010-45061 | 2/2010 |

* cited by examiner

*Primary Examiner* — Patrick Stafford
(74) *Attorney, Agent, or Firm* — Cooper & Dunham LLP

(57) ABSTRACT

A multi-beam laser light-intensity control circuit includes laser diodes; a light-receiving element for receiving a laser beam emitted from each laser diode and outputting a current corresponding to the light intensity of the received laser beam; and an automatic power control circuit for automatically controlling output power of each laser diode based on the current output from the light-receiving element. The automatic power control circuit includes a current/voltage conversion unit for converting the current output from the light-receiving element into a voltage; an error amplifying circuit for amplifying a difference voltage between the voltage output from the current/voltage conversion unit and a predetermined reference voltage; storing circuits each configured to store the difference voltage output from the error amplifying circuit in association with the corresponding laser diode; and drive current generating units each configured to generate a drive current for the corresponding laser diode based on the difference voltage.

6 Claims, 11 Drawing Sheets

MULTI-BEAM LASER LIGHT-INTENSITY CONTROL CIRCUIT AND OPTICAL SCANNING APPARATUS INCLUDING THE SAME

BACKGROUND OF THE INVENTION

1. Field of the Invention

A certain aspect of the present invention relates to a multi-beam laser light-intensity control circuit and an optical scanning apparatus including the multi-beam laser light-intensity control circuit.

2. Description of the Related Art

An optical scanning apparatus, for example, a laser scanning apparatus, forms an image using a laser beam. Such an optical scanning apparatus typically includes a laser power control device having an automatic power control (APC) function to control the light intensity of a laser beam and thereby to obtain an image with a desired density.

The APC function monitors the light intensity of a laser beam emitted from a light source such as a laser diode by receiving the laser beam with a light-receiving element such as a photodiode, and performs feedback control on a drive current supplied to the light source such that the monitored light intensity of the laser beam matches a predetermined reference value.

Japanese Patent Application Publication No. 2001-24273 discloses a multi-beam laser scanning apparatus including a laser power control device having an APC function. The disclosed multi-beam laser scanning apparatus is described below.

FIG. 5 is a schematic diagram of a multi-beam laser scanning apparatus 50 disclosed in Japanese Patent Application Publication No. 2001-24273.

In the multi-beam laser scanning apparatus 50, as shown in FIG. 5, laser beams LB emitted from laser diodes (LD) 51A and 51B are collimated by a collimator lens 53, shaped by a cylindrical lens 54, and projected onto a polygon mirror 55 being rotated at high speed. The laser beams LB are reflected by reflective surfaces of the polygon mirror 55 and are thereby deflected in the main-scanning direction. Then, the deflected laser beams LB pass through an f θ lens 56 and scan a photosensitive surface of a photosensitive drum 57 in the main-scanning direction.

The photosensitive drum 57 rotates around a rotational shaft 57a extending in the main-scanning direction and as a result, the photosensitive surface of the photosensitive drum 57 is scanned by the laser beams LB also in the sub-scanning direction. The laser beams LB are modulated according to image data so that a desired image or a desired pattern is drawn.

A synchronization photodiode 58 is disposed near one end of the photosensitive drum 57. The synchronization photodiode 58 receives the laser beams LB before they scan the photosensitive drum 57 in the main-scanning direction, and outputs horizontal synchronization signals used as timing signals for the main scanning and the APC control. Meanwhile, a part of each of the laser beams LB emitted from the laser diodes (LD) 51A and 51B is detected by a light-receiving element (photodiode) 52. Based on the detection results from the light-receiving element 52, a laser power control circuit (APC circuit) 59 controls the output power of the laser diodes (LD) 51A and 51B before the photosensitive drum 57 is scanned in the main-scanning direction.

FIG. 6 is a circuit diagram of a related-art laser diode driving device 30 (corresponding to the laser power control circuit (APC circuit) 59 of FIG. 5). In FIG. 6, it is assumed that the number of laser beams (or laser diodes) is two.

As shown in FIG. 6, the laser diode driving device 30 includes an automatic light-intensity control circuit 300. The automatic light-intensity control circuit 300 includes a PD control circuit A 301a, a sample-and-hold (S/H) circuit 1 302 including an error amplifying circuit A 3021 and a hold circuit A 3022, and a drive current generating circuit A 304 for automatic power control (APC) of a laser diode LD1; and a PD control circuit B 301b, a sample-and-hold (S/H) circuit 2 303 including an error amplifying circuit B 3031 and a hold circuit B 3032, and a drive current generating circuit B 305 for APC of a laser diode LD2.

Each of the PD control circuit A 301a and the PD control circuit B 301b converts a feedback current ID, which is generated by a light-receiving element PD and corresponds to the light intensity of a laser beam emitted from the laser diode LD1 (channel 1) or the laser diode LD2 (channel 2), into a feedback voltage VD.

The feedback current ID from the light-receiving element PD flows through a resistor Rpd1 or a resister Rpd2. Each of the resistors Rpd1 and Rpd2 causes a voltage drop and thereby generates the feedback voltage VD. Using variable resistors as the resistors Rpd1 and Rpd2 makes it possible to perform voltage conversion according to laser diode characteristics of the laser diode LD1 and the laser diode LD2 (the channels 1 and 2).

The error amplifying circuit A 3021 and the error amplifying circuit B 3031, respectively, compare feedback voltages VD obtained by the PD control circuit A 301a and the PD control circuit B 301b with predetermined reference voltages Vref1 and Vref2. For example, the reference voltages Vref1 and Vref2 are set at values that are equal to feedback voltages VD corresponding to the light intensities of the laser diode LD1 and the laser diode LD2 under normal operating conditions.

Each of the hold circuit A 3022 and the hold circuit B 3032 holds a difference voltage between the feedback voltage VD and the reference voltage Vref1 or Vref2. After APC is completed, the difference voltages are held to stably maintain the controlled state.

The drive current generating circuit A 304 and the drive current generating circuit B 305, respectively, increase or decrease LD drive currents based on positive or negative voltages held in the hold circuit A 3022 and the hold circuit B 3032.

Thus, feedback control is performed on the drive currents of the laser diodes LD1 and LD2 and the light intensities of the laser diodes LD1 and LD2 are thereby controlled to match the reference voltages Vref1 and Vref2.

In FIG. 6, enable signals XAPCEN1 and XAPCEN2 enable APC functions for the corresponding laser diodes LD1 and LD2. Image pattern data DATA1 and DATA2 are used to modulate the output power of the laser diodes LD1 and LD2 to form a desired image on a photosensitive drum (the photosensitive drum 57 of FIG. 5). In other words, the drive currents of the laser diodes LD1 and LD2 are turned on and off according to the image pattern data DATA1 and DATA2. The enable signals and the image pattern data are, for example, input from an external computer.

FIG. 7 is a flowchart showing a process performed by the laser power control circuit (APC circuit) 59 of FIG. 5. Here, it is assumed that the laser power control circuit (APC circuit) 59 has a configuration corresponding to the laser diode driving device 30 of FIG. 6.

Since operations of two channels corresponding to the laser diodes LD1 and LD2 are substantially the same, circuits related to the channel of the laser diode LD1 are used in the descriptions below and circuits related to the channel of the laser diode LD2 are shown in parentheses.

When the laser diode LD1 (the laser diode LD2) is turned on (step S101), the light-receiving element PD receives the laser beam emitted from the laser diode LD1 (the laser diode LD2) and outputs an electric current, i.e., a feedback current ID, corresponding to the received laser beam (steps S102 and S103).

The feedback current ID is converted into a feedback voltage VD by the PD control circuit A 301a (the PD control circuit B 301b) (step S104), and the feedback voltage VD is compared with the first reference voltage Vref1 (the second reference voltage Vref2) by the error amplifying circuit A 3021 (the error amplifying circuit B 3031) of the S/H circuit 1 302 (the S/H circuit 2 303) (step S105).

The error amplifying circuit A 3021 (the error amplifying circuit B 3031) determines whether the feedback voltage VD is lower than the reference voltage Vref1 (the reference voltage Vref2). When the feedback voltage VD is lower than the reference voltage Vref1 (the reference voltage Vref2) (YES in step S105), the difference voltage represented by "reference voltage Vref1 (or reference voltage Vref2)−feedback voltage VD" becomes a positive voltage and the positive voltage is held in the hold circuit A 3022 (the hold circuit B 3032) (step S106). Then, the drive current generating circuit A 304 (the drive current generating circuit B 305) is controlled based on the positive voltage (value) to increase the LD drive current (step S107). As a result, the output power of the laser diode LD1 (the laser diode LD2) increases, the feedback current ID from the light-receiving element PD increases, and the difference voltage between the feedback voltage VD and the reference voltage Vref1 (the reference voltage Vref2) decreases.

When the feedback voltage VD is higher than the reference voltage Vref1 (the reference voltage Vref2) (NO in step S105), the difference voltage represented by "reference voltage Vref1 (or reference voltage Vref2)−feedback voltage VD" becomes a negative voltage and the negative voltage is held in the hold circuit A 3022 (the hold circuit B 3032) (step S108). Then, the drive current generating circuit A 304 (the drive current generating circuit B 305) is controlled based on the negative voltage (value) to decrease the LD drive current (step S109). As a result, the output power of the laser diode LD1 (the laser diode LD2) decreases, the feedback current ID from the light-receiving element PD decreases, and the difference voltage between the feedback voltage VD and the reference voltage Vref1 (the reference voltage Vref2) decreases.

By repeating the above steps, the difference between the reference voltage and the feedback voltage becomes substantially zero and the output power of the laser diode LD1 (the laser diode LD2) matches the reference voltage Vref1 (the reference voltage Vref2). Through the above process, automatic power control (APC) is performed for the laser diode LD1 (the laser diode LD2).

With a related-art multi-beam laser scanning apparatus as described above, an image can be formed at high speed by using multiple laser beams emitted from laser diodes (semiconductor lasers) at once. Such a related-art multi-beam laser scanning apparatus includes a laser power control device (circuit), and the laser power control device includes, separately for each laser diode, a photodiode (light-receiving element) for monitoring light intensity and an APC function including a sample-and-hold circuit.

Meanwhile, in a multi-beam laser diode that is a collection of multiple laser diodes (semiconductor lasers) integrated in a package, the number of photodiodes for monitoring light intensity is generally one, or smaller than the number of laser diodes (see, for example, Japanese Patent Application Publication No. 2001-024273). However, in the multi-beam laser diode, an APC function including an error amplifying circuit is provided separately for each laser diode to control the light intensity.

Thus, in the related art, an error amplifying circuit is provided separately for each laser diode. Such a configuration increases the mounting area (or the size) and the costs of a laser power control device.

SUMMARY OF THE INVENTION

In an aspect of this disclosure, there is provided a multi-beam laser light-intensity control circuit including multiple laser diodes; a single light-receiving element configured to receive a laser beam emitted from each of the laser diodes and to output a current corresponding to the light intensity of the received laser beam; and an automatic power control circuit configured to automatically control output power of each of the laser diodes based on the current output from the light-receiving element. The automatic power control circuit includes a current/voltage conversion unit configured to convert the current output from the light-receiving element into a voltage; a single error amplifying circuit provided for the laser diodes and configured to amplify a difference voltage between the voltage output from the current/voltage conversion unit and a predetermined reference voltage and to output the amplified difference voltage; storing circuits each configured to store the difference voltage output from the error amplifying circuit in association with a corresponding one of the laser diodes; and drive current generating units each configured to generate a drive current for driving the corresponding one of the laser diodes based on the difference voltage stored in a corresponding one of the storing circuits.

DESCRIPTION OF THE PREFERRED EMBODIMENTS

Preferred embodiments of the present invention are described below with reference to the accompanying drawings.

<Outline>

An aspect of the present invention provide a multi-beam optical scanning apparatus that forms an image by scanning a photoconductor with light beams emitted from multiple light sources. The multi-beam optical scanning apparatus includes a laser power control device (or circuit) for automatically controlling the output power of the light sources. The laser power control device includes one error amplifying circuit for the multiple light sources. The laser power control device detects the intensities of light beams from the light sources using one light-receiving unit and automatically controls the output power of the light sources based on the detection results in a time sharing manner.

<First Embodiment>

Figure 1A:
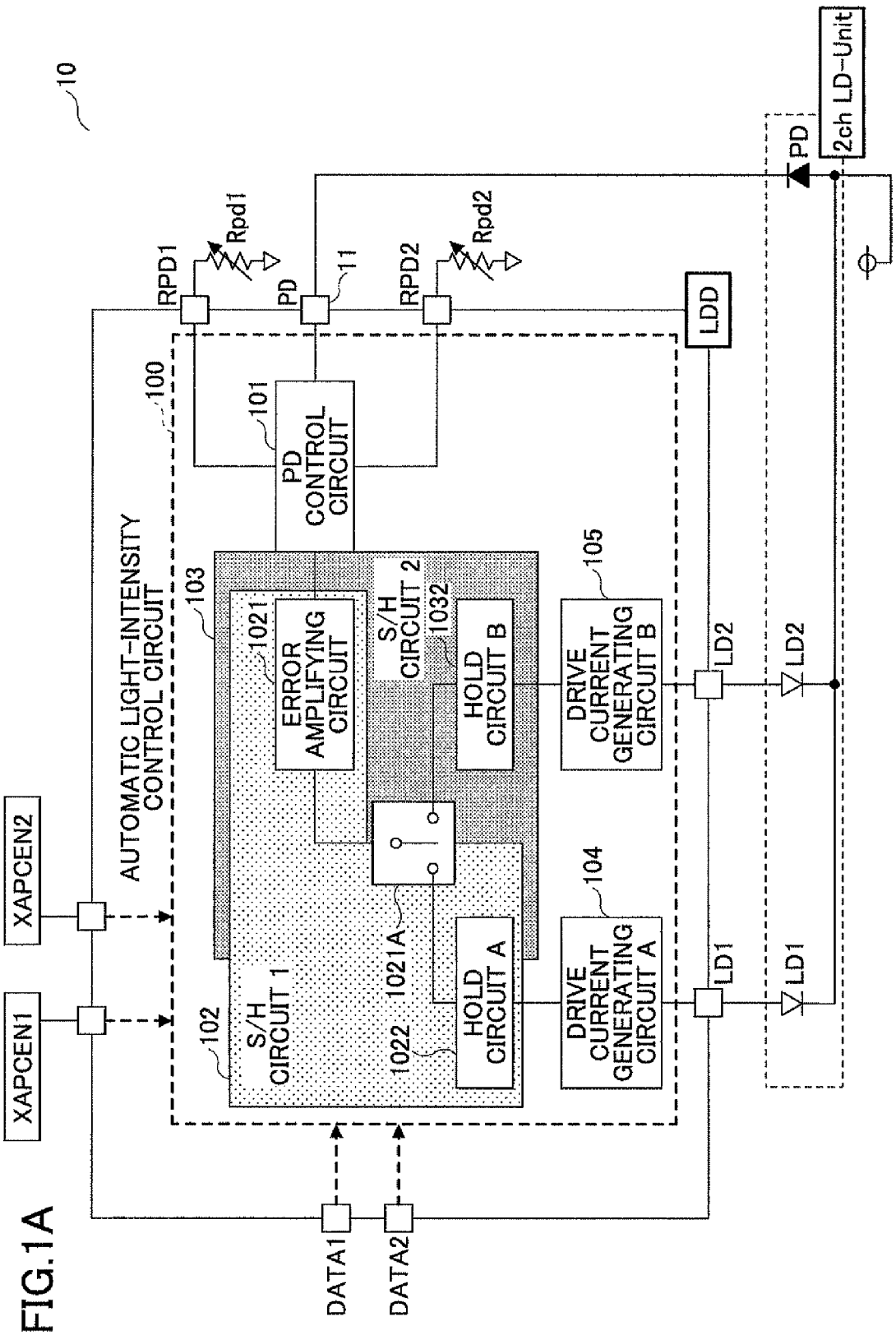
FIG. 1A is a circuit diagram of a multi-beam laser light-intensity control circuit according to a first embodiment of the present invention.

FIG. 1A is a block diagram of a multi-beam laser light-intensity control circuit 10 according to a first embodiment of the present invention. In FIG. 1A, it is assumed that the number of laser beams (or laser diodes) is two.

Figure 1B:
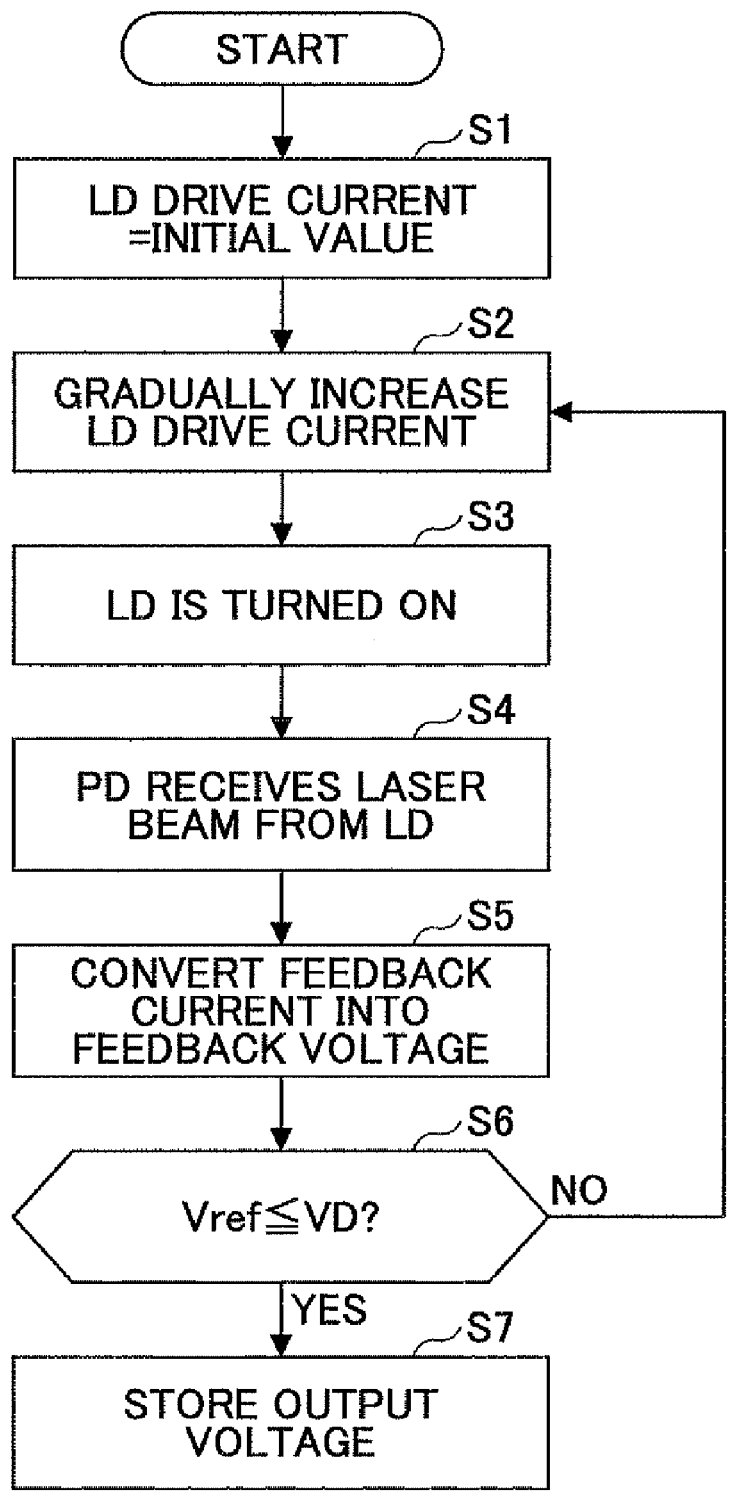
FIG. 1B is a flowchart showing an automatic light, intensity control process performed by a multi-beam laser light-intensity control circuit.
Figure 1C:
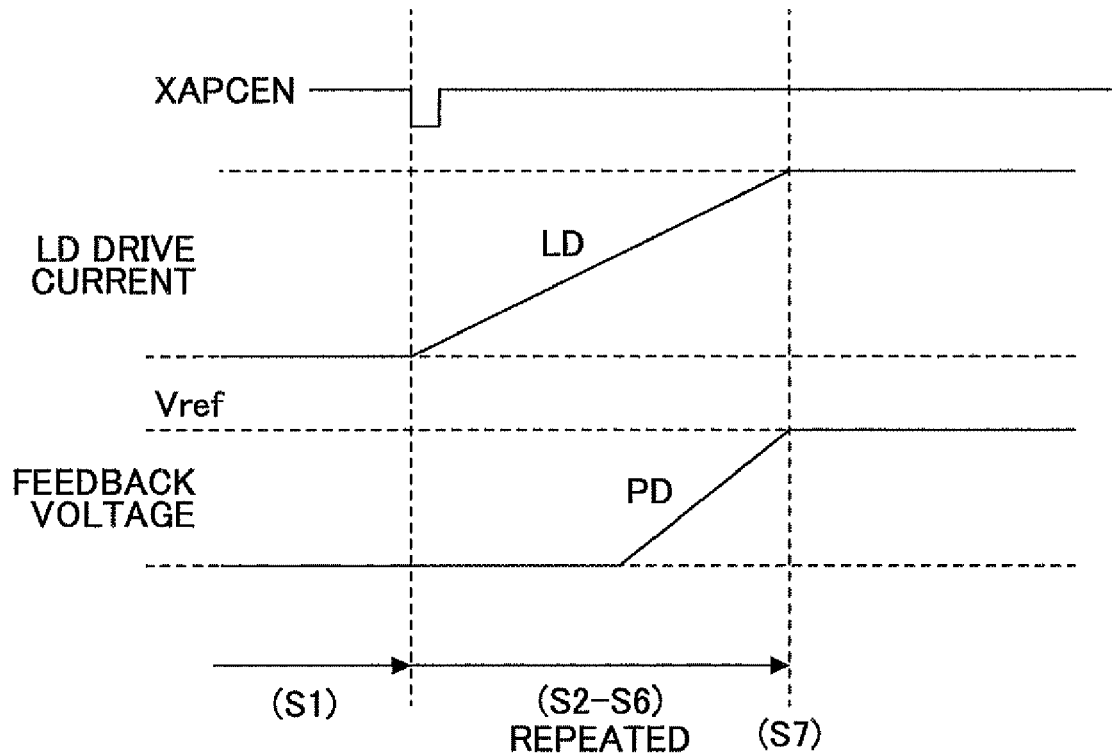
FIG. 1C is a timing chart used to describe the process shown in FIG. 1B.

FIG. 1B is a flowchart showing an automatic light intensity control process performed by the multi-beam laser light-intensity control circuit 10. FIG. 1C is a timing chart used to describe the process shown in FIG. 1B. The multi-beam laser light-intensity control circuit 10 and the automatic light intensity control process of this embodiment are described below with reference to FIGS. 1A through 1C.

As shown in FIG. 1A, the multi-beam laser light-intensity control circuit 10 includes an automatic light intensity control circuit 100 including a PD control circuit 101, an error amplifying circuit 1021, hold circuits 1022 and 1032, and drive current generating circuits 104 and 105.

The PD control circuit 101 converts a feedback current corresponding to the light intensity of a laser beam monitored by a light-receiving element PD into a feedback voltage. The error amplifying circuit 1021 compares the feedback voltage from the PD control circuit 101 with a predetermined reference voltage. The above operations of the PD control circuit 101 and the error amplifying circuit 1021 are common to all laser beams, i.e., laser diodes LD1 and LD2.

When performing automatic power control (APC) for a channel 1 (corresponding to the laser diode LD1), the drive current of the laser diode LD1 is initialized (e.g., the drive current is set at an initial value smaller than a current corresponding to a desired light intensity) (step S1 in FIGS. 1B and 1C), and then the drive current is gradually increased (step S2). As a result, the laser diode LD1 is turned on (step S3). The light-receiving element PD receives a laser beam from the laser diode LD1 (step D4) and the PD control circuit 101 converts a feedback current ID generated by the light-receiving element PD into a feedback voltage VD (step S5).

Next, the error amplifying circuit 1021 compares the feedback voltage VD with a reference voltage Vref1 (step S6). If the feedback voltage VD is less than the reference voltage Vref1 (NO in step S6), the process returns to step S2 and the drive current is further increased.

Steps S2 through S6 are repeated until the feedback voltage VD becomes greater than or equal to the reference voltage Vref1. When the feedback voltage VD becomes greater than or equal to the reference voltage Vref1 (YES in step S6), a switch 1021a is connected to the hold circuit A 1022 and the current output voltage from the error amplifying circuit 1021 is stored in the hold circuit A 1022 for the laser diode LD1 (step S7).

Similarly, when performing automatic power control (APC) for a channel 2 (corresponding to the laser diode LD2), the drive current of the laser diode LD2 is initialized (e.g., the drive current is set at an initial value smaller than a current corresponding to a desired light intensity) (step S1 of FIG. 1B), and then the drive current is gradually increased (step S2). As a result, the laser diode LD2 is turned on (step S3). The light-receiving element PD receives a laser beam from the laser diode LD2 (step D4) and the PD control circuit 101 converts a feedback current ID generated by the light-receiving element PD into a feedback voltage VD (step S5).

Next, the error amplifying circuit 1021 compares the feedback voltage VD with a reference voltage Vref2 (step S6). If the feedback voltage VD is less than the reference voltage Vref2 (NO in step S6), the process returns to step S2 and the drive current is further increased.

Steps S2 through S6 are repeated until the feedback voltage VD becomes greater than or equal to the reference voltage Vref2. When the feedback voltage VD becomes greater than or equal to the reference voltage Vref2 (YES in step S6), the switch 1021a is connected to the hold circuit B 1032 and the current output voltage from the error amplifying circuit 1021 is stored in the hold circuit B 1032 for the laser diode LD2 (step S7).

Thus, the automatic light intensity control process (or APC) is performed sequentially for the respective channels and voltages corresponding to desired light intensities are stored. The automatic light intensity control process of FIG. 1B performed by the multi-beam laser light-intensity control circuit 10 is also applicable to second and third embodiments described later.

The drive current generating circuit A 104 and the drive current generating circuit B 105 generate LD drive currents for the corresponding channels (i.e., the laser diodes LD1 and LD2) based on the voltages stored in the hold circuit A 1022 and the hold circuit B 1032. The reference voltages Vref1 and Vref2 used by the error amplifying circuit 1021 may be determined such that desired LD drive currents are generated by the drive current generating circuit A 104 and the drive current generating circuit B 105 and the light intensities of the laser diodes LD1 and LD2 are optimized under normal operating conditions.

The automatic light intensity control process (or APC) is performed sequentially for the channel 1 and the channel 2 according to enable signals XAPCEN1 and XAPCEN2.

The above embodiment makes it possible to automatically increase the drive currents of the laser diodes LD1 and LD2 when their light intensities become lower than predetermined levels and to automatically decrease the drive currents of the laser diodes LD1 and LD2 when their light intensities become higher than the predetermined levels.

In FIG. 1A, the feedback current ID corresponding to the light intensity of a laser beam monitored by the light-receiving element PD flows through a resistor Rpd1 or a resister Rpd2. Each of the resistors Rpd1 and Rpd2 causes a voltage drop and thereby generates the feedback voltage VD. Using variable resistors as the resistors Rpd1 and Rpd2 makes it possible to perform voltage conversion according to laser diode characteristics of the laser diode LD1 and the laser diode LD2 (the channels 1 and 2).

Also in FIG. 1A, the enable signals XAPCEN1 and XAPCEN2 enable APC functions for the corresponding laser diodes LD1 and LD2. Image pattern data DATA1 and DATA2 are used to modulate the output power of the laser diodes LD1 and LD2 to form a desired image on a photosensitive drum. In other words, the drive currents of the laser diodes LD1 and LD2 are turned on and off according to the image pattern data DATA1 and DATA2. The enable signals and the image pattern data are, for example, input from an external computer.

Figure 6:
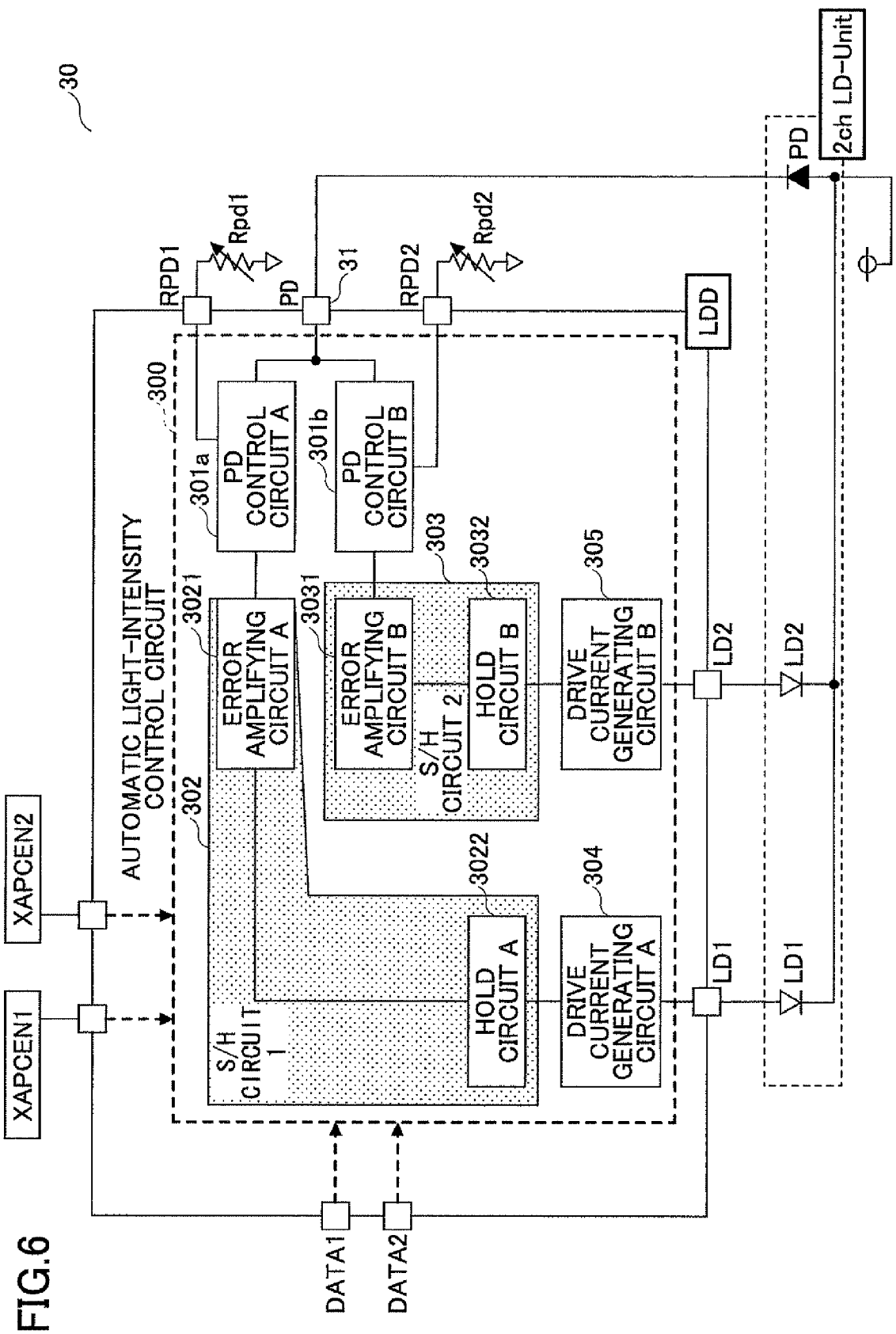
FIG. 6 is a circuit diagram of a related-art laser diode driving device.
Figure 7:
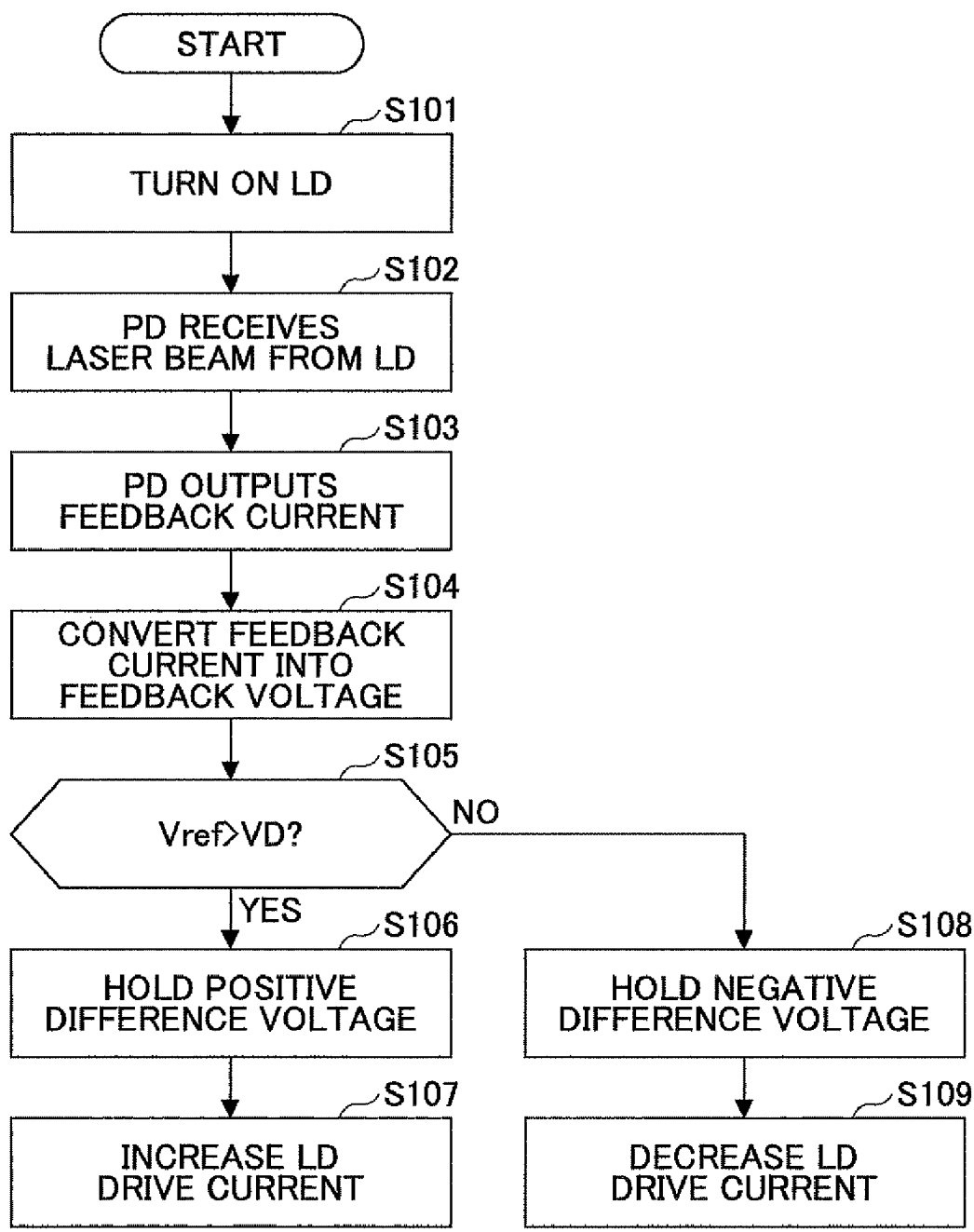
FIG. 7 is a flowchart showing a process performed by a laser power control circuit (APC circuit) 59 of FIG. 5.

With the related-art configuration shown in FIG. 6, an error amplifying circuit is provided for each channel (i.e., for each laser diode). Such a configuration increases the mounting area (or the size) and the costs of a multi-beam laser light-intensity control circuit (or an APC circuit). Meanwhile, with the configuration of the first embodiment, only one error amplifying circuit is provided regardless of the number of channels (or laser diodes). Thus, the first embodiment makes it possible to reduce the mounting area (or the size) and the costs of a multi-beam laser light-intensity control circuit (or an APC circuit).

<Second Embodiment>

Figure 2:
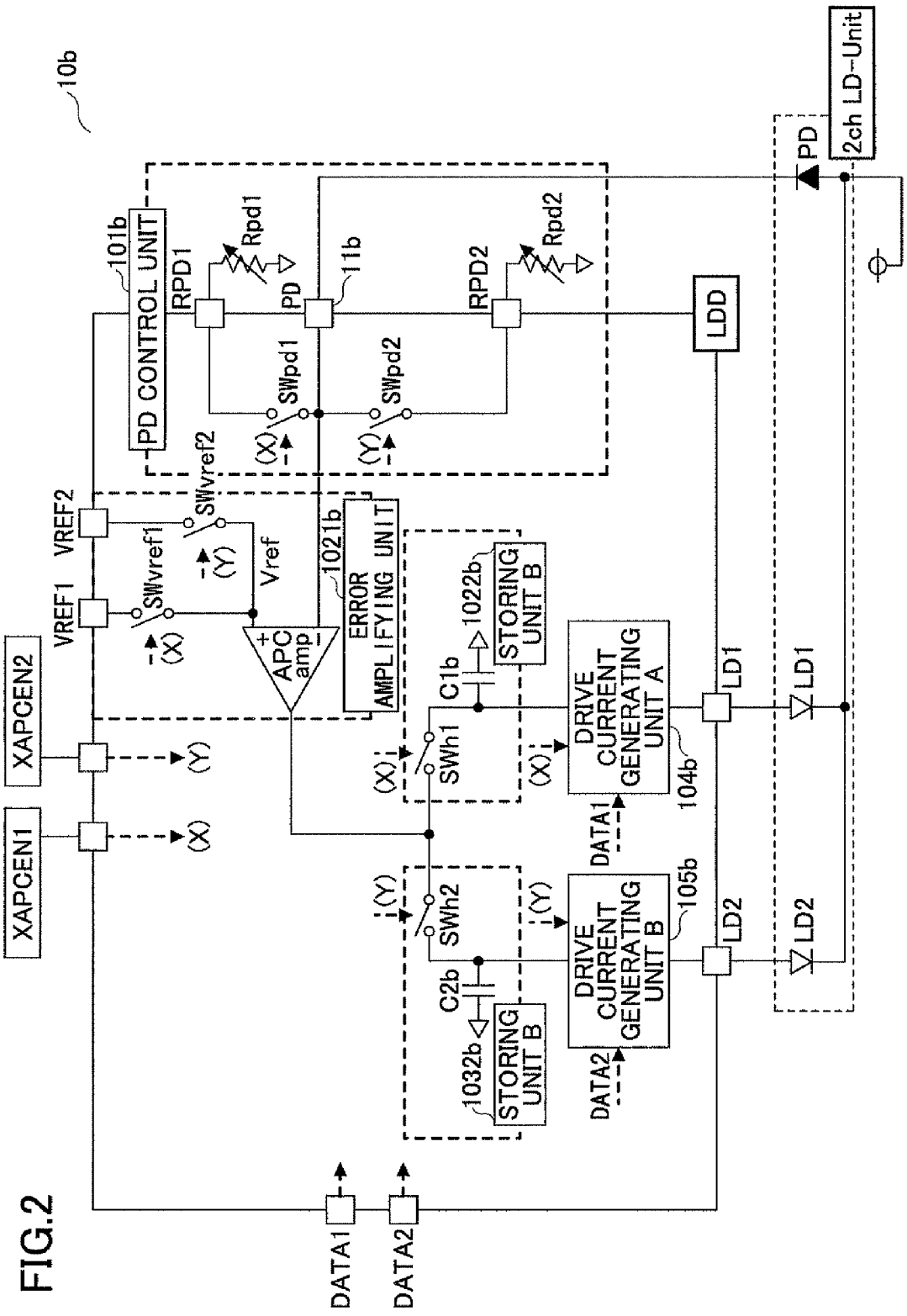
FIG. 2 is a circuit diagram of a multi-beam laser light-intensity control circuit according to a second embodiment of the present invention.
Figure 3:
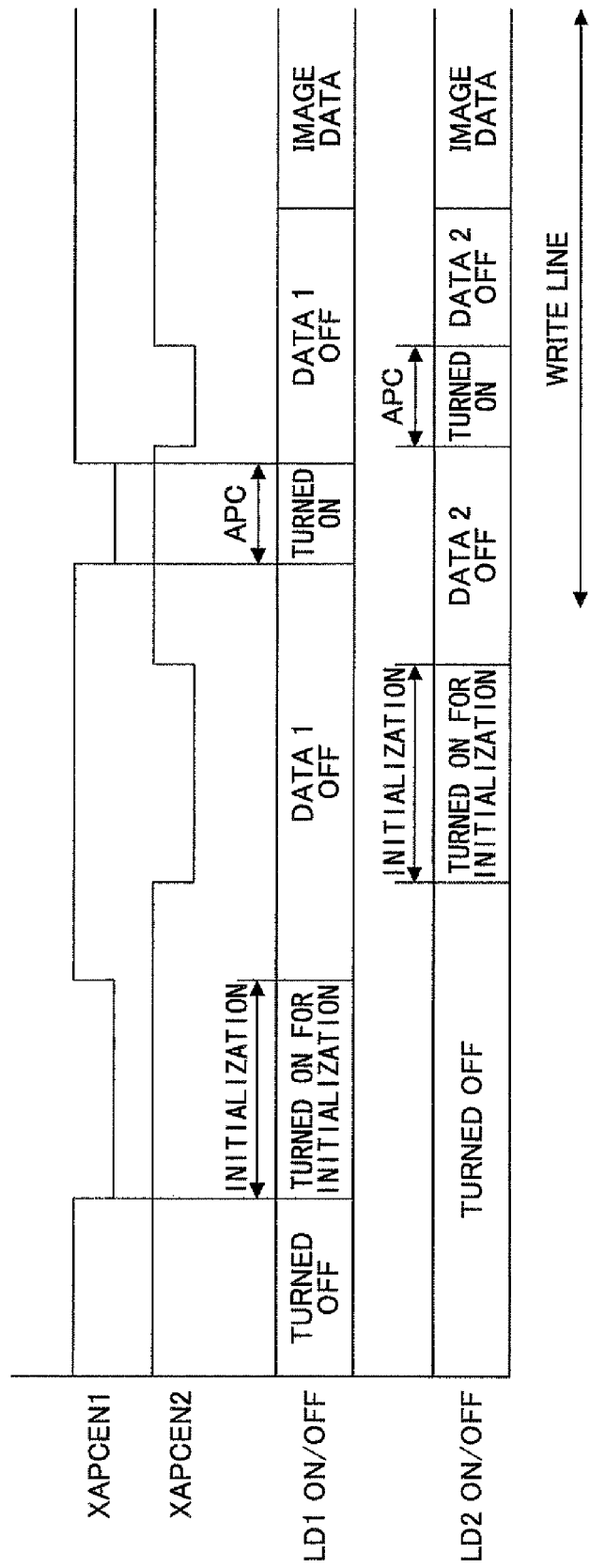
FIG. 3 is a timing chart showing enable signals XAPCEN1 and XAPCEN2 and signals of image pattern data DATA1 and DATA2.

FIG. 2 is a circuit diagram of a multi-beam laser light-intensity control circuit 10b according to a second embodiment of the present invention. FIG. 3 is a timing chart showing enable signals XAPCEN1 and XAPCEN2 and signals of image pattern data DATA1 and DATA2.

FIRST COMPARATIVE EXAMPLE

Figure 8:
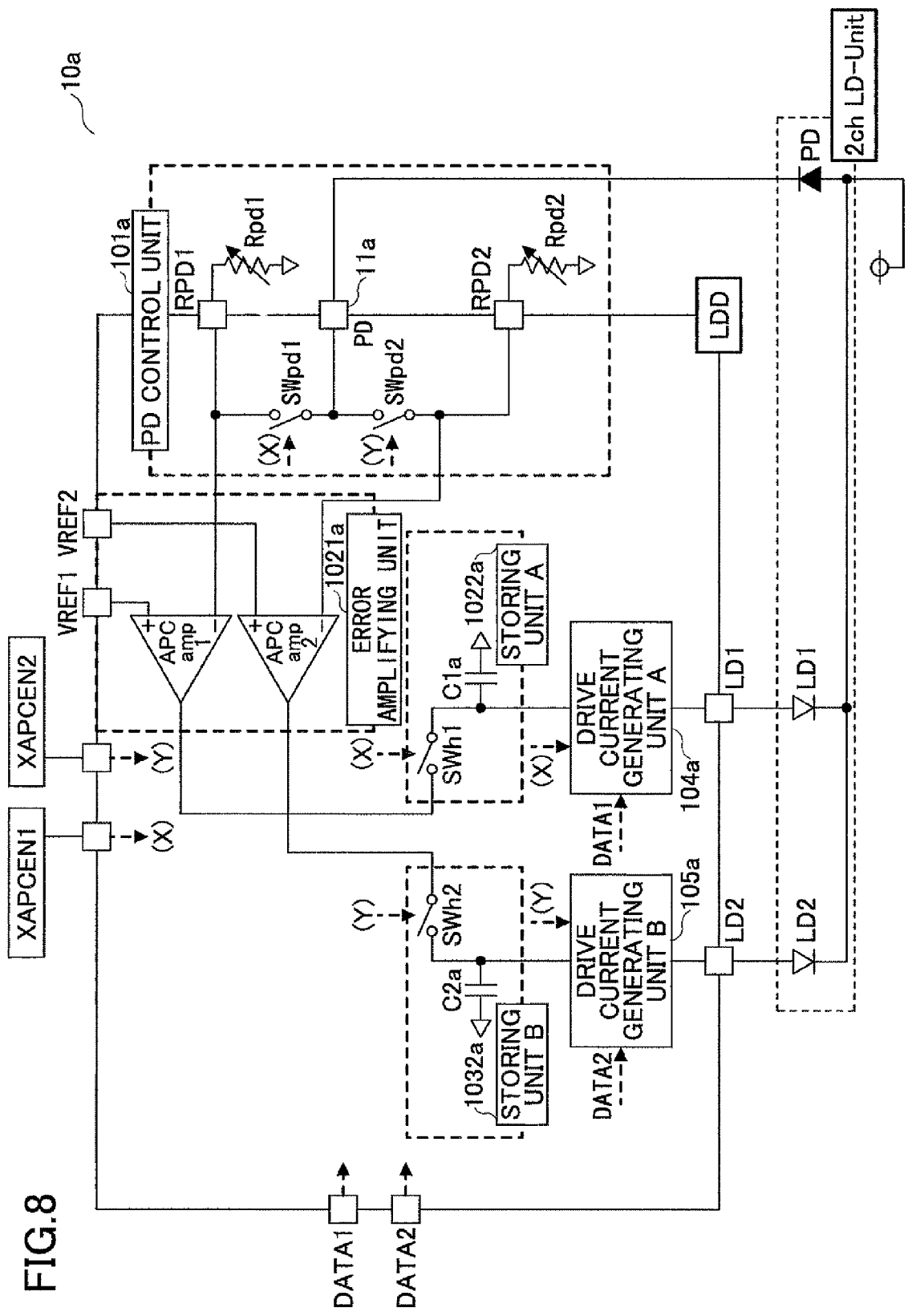
FIG. 8 is a circuit diagram of a multi-beam laser light-intensity control circuit of a first comparative example.

Before describing the second embodiment shown in FIG. 2, a first comparative example is described with reference to FIG. 8. In the first comparative example, an error amplifying circuit is provided for each channel.

In a multi-beam laser light-intensity control circuit 10a of the first comparative example, it is assumed that the number of channels or the number of laser beams (i.e., laser diodes) is two. As shown in FIG. 8, the multi-beam laser light-intensity control circuit 10a includes a PD control unit 101a, an error amplifying unit 1021a, a storing unit A 1022a, a storing unit B 1032a, a drive current generating unit A 104a, and a drive current generating unit B 105a.

Resistors Rpd1 and Rpd2, enable signals XAPCEN1 and XAPCEN2, and image pattern data DATA1 and DATA2 are substantially the same as those in the first embodiment. In this comparative example, the enable signals XAPCEN1 (X) and XAPCEN2 (Y) are input to select the corresponding channels.

The PD control circuit 101a converts a feedback current corresponding to the light intensity of a laser beam monitored by a light-receiving element PD into a feedback voltage.

More specifically, when automatic power control (APC) is performed for a channel 1 (corresponding to a laser diode LD1), a switch SWpd1 is turned on and a switch SWpd2 is turned off by the enable signal XAPCEN1. As a result, the channel 1 is grounded via the resistor Rpd1 and a feedback voltage VD1 is obtained.

Meanwhile, when APC is performed for a channel 2 (corresponding to a laser diode LD2), the switch SWpd1 is turned off and the switch SWpd2 is turned on by the enable signal XAPCEN2. As a result, the channel 2 is grounded via the resistor Rpd2 and a feedback voltage VD2 is obtained.

Thus, in this comparative example, the resistors Rpd1 and Rpd2 are provided for the respective channels and the switches SWpd1 and SWpd2 are turned on and off by the enable signals XAPCEN1 and XAPCEN2.

The error amplifying unit 1021a compares the feedback voltage VD1 or VD2 obtained by the PD control unit 101a with a reference voltage (the voltage from a terminal VREF1 or a terminal VREF2) by using an error amplifying circuit (APCamp1 or APCamp2) provided for the corresponding channel. The reference voltages (the voltages from the terminal VREF1 and the terminal VREF2) may be determined such that desired LD drive currents are generated by the drive current generating unit A 104a and the drive current generating unit B 105a and the light intensities of the laser diodes LD1 and LD2 are optimized under normal operating conditions.

More specifically, when APC is performed for the channel 1 (corresponding to the laser diode LD1), the switch SWpd1 is turned on and the switch SWpd2 is turned off by the enable signal XAPCEN1, and the voltage from the terminal VREF1 is compared with the feedback voltage (monitored voltage) VD1 by the error amplifying circuit (Acamp1) for the channel 1.

Meanwhile, when APC is performed for the channel 2 (corresponding to the laser diode LD2), the switch SWpd1 is turned off and the switch SWpd2 is turned on by the enable signal XAPCEN2, and the voltage from the terminal VREF2 is compared with the feedback voltage (monitored voltage) VD2 by the error amplifying circuit (APCamp2) for the channel 2.

The storing unit A 1022a and the storing unit B 1032a store output voltages from the error amplifying unit 1021a (Acamp1 and APCamp2) in a capacitor C1a and a capacitor C2, respectively.

More specifically, when APC is performed for the channel 1 (corresponding to the laser diode LD1), a switch SWh1 is turned on and a switch SWh2 is turned off by the enable signal XAPCEN1, and an output voltage from the error amplifying circuit (APCamp1) is stored in the storing circuit (capacitor C1a) of the storing unit A 1022a.

Meanwhile, when APC is performed for the channel 2 (corresponding to the laser diode LD2), the switch SWh1 is turned off and the switch SWh2 is turned on by the enable signal XAPCEN2, and an output voltage from the error amplifying circuit (APCamp2) is stored in the storing circuit (capacitor C2a) of the storing unit B 1032a.

The drive current generating unit A 104a and the drive current generating unit B 105a repeatedly increase or decrease the drive currents until desired intensities (voltages) are detected by the two error amplifying circuits (Acamp1 and APCamp2) of the error amplifying unit 1021a, i.e., until desired light intensities of the laser diodes LD1 and LD2 are achieved.

<Second Embodiment>

The second embodiment of the present invention is described below with reference to FIG. 2. A multi-beam laser light-intensity control circuit 10b of this embodiment is different from the first comparative example of FIG. 8 in that the error amplifying unit 1021a is replaced with an error amplifying unit 1021b.

In the first comparative example, the error amplifying unit 1021a includes two error amplifying circuits (Acamp1 and APCamp2) corresponding to different reference voltages for the channels 1 and 2. Meanwhile, in this embodiment, the error amplifying unit 1021b includes only one error amplifying circuit (APCamp) and different reference voltages from the terminal VREF1 and the terminal VREF2 are switched by the enable signals XAPCEN1 (X) and XAPCEN2 (Y).

The reference voltages (the voltages from the VREF1 terminal and the VREF2 terminal) may be determined such that desired LD drive currents are generated by a drive current generating unit A 104b and a drive current generating unit B 105b and the light intensities of the laser diodes LD1 and LD2 are optimized under normal operating conditions.

More specifically, when APC is performed for the channel 1 (corresponding to the laser diode LD1), a switch SWvref1 is turned on and a switch SWvref2 is turned off by the enable signal XAPCEN1, and the voltage from the terminal VREF1 is compared with the feedback voltage (monitored voltage) VD1 by the error amplifying circuit (APCamp).

Meanwhile, when APC is performed for the channel 2 (corresponding to the laser diode LD2), the switch SWvref1 is turned off and the switch SWvref2 is turned on by the enable signal XAPCEN2, and the voltage from the terminal VREF2 is compared with the feedback voltage (monitored voltage) VD2 by the error amplifying circuit (APCamp).

Descriptions of components other than the error amplifying unit 1021b are omitted here because those components are substantially the same as the components of the multi-beam laser light-intensity control circuit 10a of the first comparative example.

The configuration of the second embodiment makes it possible to generate desired drive currents to achieve desired light intensities corresponding to the characteristics of laser diodes (channels). Also, performing APC regularly makes it possible to compensate for characteristic changes of laser diodes due to aging and temperature changes.

With the configuration of the first comparative example, an error amplifying circuit is provided for each channel (i.e., for each laser diode). Such a configuration increases the mounting area (or the size) and the costs of a multi-beam laser light-intensity control circuit (or an APC circuit). Meanwhile, with the configuration of the second embodiment, only one error amplifying circuit is provided regardless of the number of channels (or laser diodes). Thus, the second embodiment makes it possible to reduce the mounting area (or the size) and the costs of a multi-beam laser light-intensity control circuit (or an APC circuit).

FIG. 3 is a timing chart showing enable signals XAPCEN1 and XAPCEN2 and signals of image pattern data DATA1 and DATA2.

As shown in FIG. 3, when the enable signal XAPCEN1 is low, an APC process for the laser diode LD1 is performed and the laser diode LD2 is turned off. Meanwhile, when the enable signal XAPCEN2 is low, an APC process for the laser diode LD2 is performed and the laser diode LD1 is turned off.

When multiple laser beams or multiple laser diodes are used (although two channels are used in the embodiments of the present invention, the number of channels may be three or more), APC processes are performed sequentially for the multiple laser beams by time sharing. There are two types of APC processes: the first is an initialization APC process performed only once at the beginning and a periodic APC process performed periodically. In either case, steps performed in the APC process are substantially the same as described above.

During formation of an image, drive currents determined by the APC processes for the respective channels are generated when signals of the image pattern data DATA1 and DATA2 from terminals DATA1 and DATA2 are high, but are not generated when the signals are low. As a result, a desired image corresponding to the image pattern data DATA1 and DATA2 is formed.

<Third Embodiment>

Figure 4:
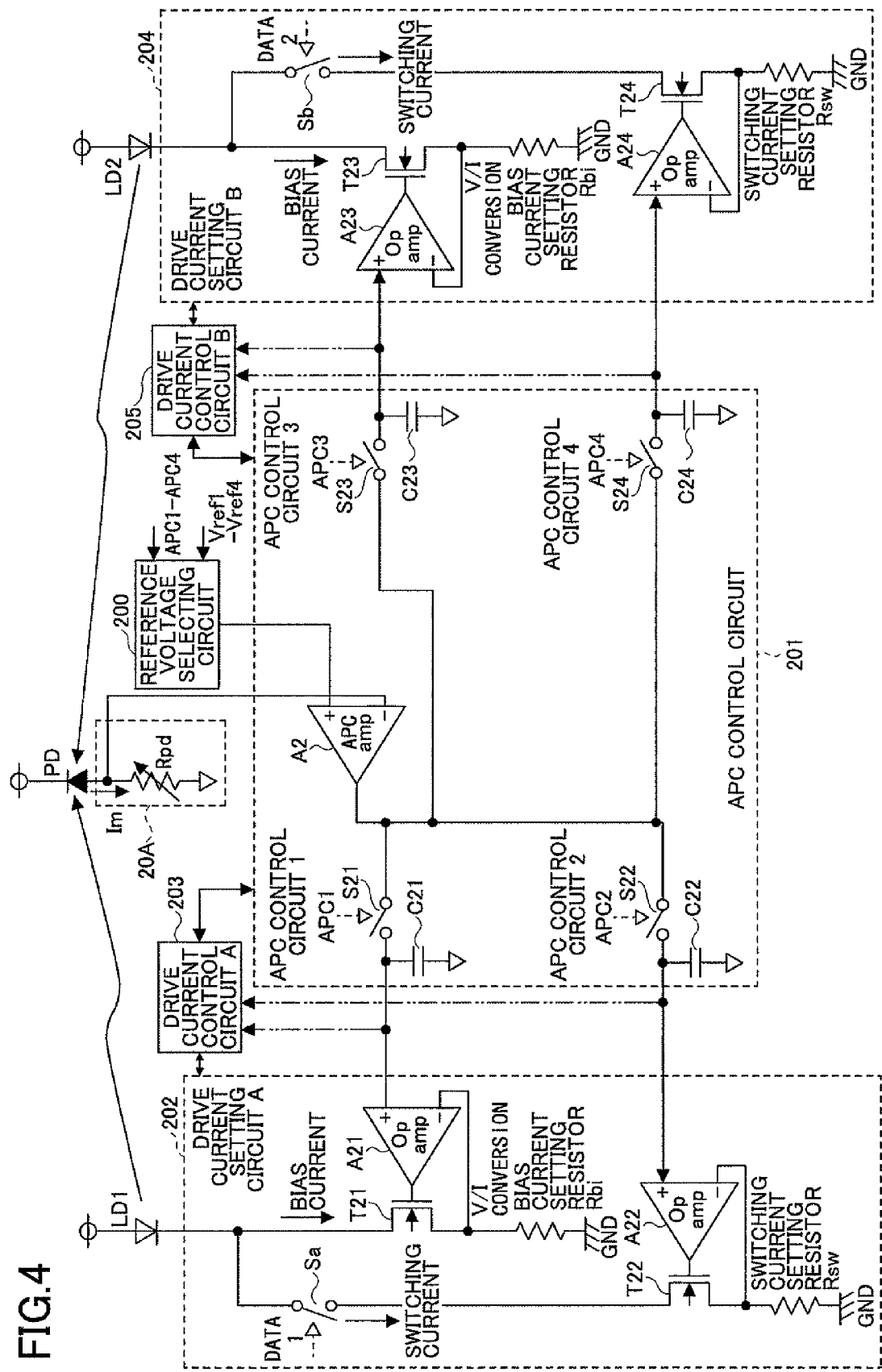
FIG. 4 is a circuit diagram of a multi-beam laser light-intensity control circuit according to a third embodiment of the present invention.
Figure 5:
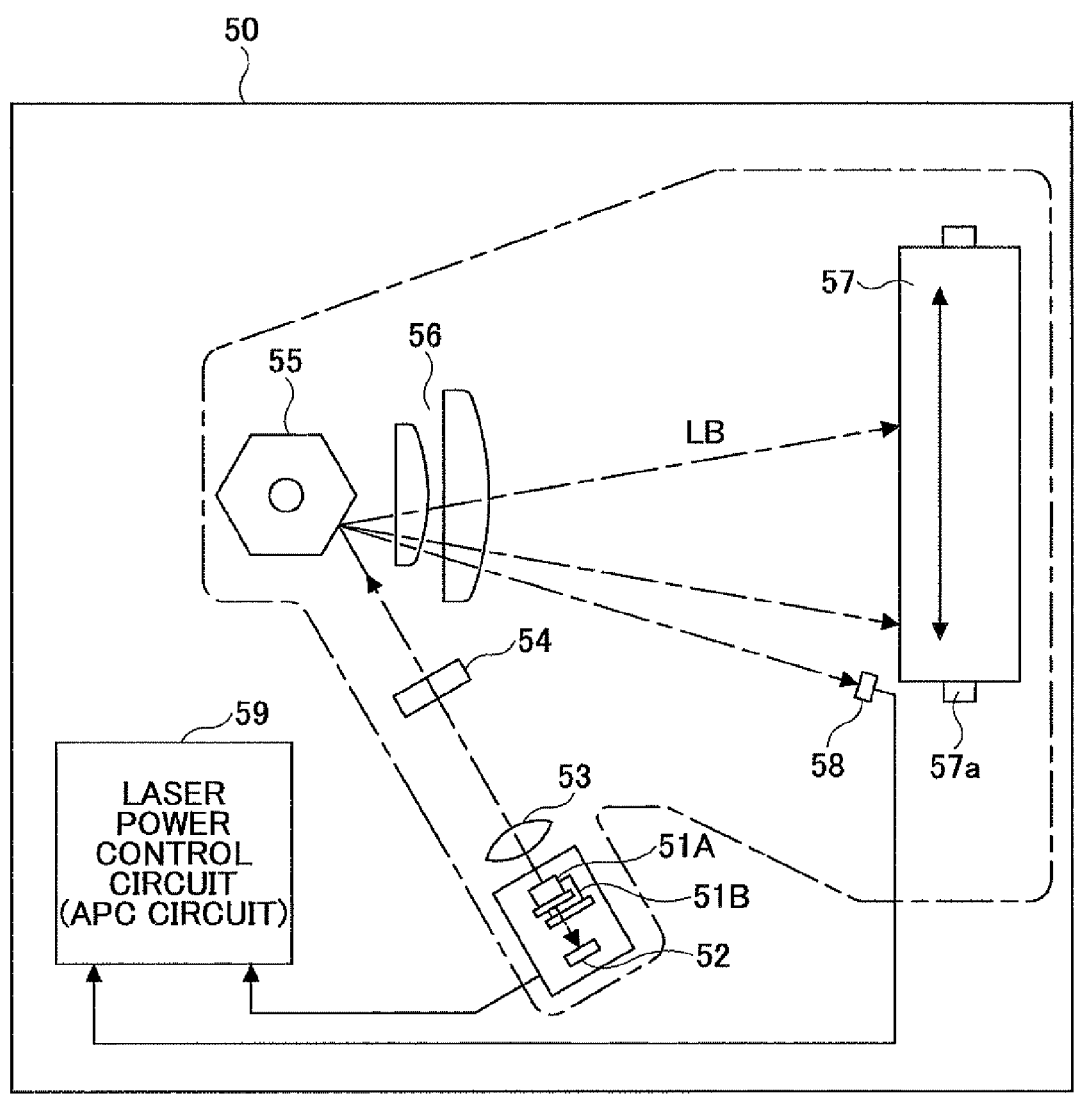
FIG. 5 is a schematic diagram of a related-art multi-beam laser scanning apparatus.

FIG. 4 is a circuit diagram of a multi-beam laser light-intensity control circuit according to a third embodiment of the present invention.

In the third embodiment, as shown in FIG. 4, one error amplifying circuit is provided for multiple channels (in this example, two channels) to perform automatic power control (APC).

The multi-beam laser light-intensity control circuit of this embodiment shown in FIG. 4 includes an APC control circuit 201 for performing APC and drive current setting circuits 202 and 204 for setting drive currents for the corresponding channels, i.e., laser diodes LD1 and LD2.

The drive current setting circuit A 202 sets a drive current for the laser diode LD1 and includes an LD1 bias current driving circuit and an LD1 switching current driving circuit.

The LD1 bias current driving circuit sets a drive current to be supplied to the laser diode LD1 during normal operations (e.g., when no image is being formed according to image pattern data). The LD1 bias current driving circuit includes a transistor T21 and a bias current setting resistor Rbi that are connected in series; and an error amplifying circuit A21 the output terminal of which is connected to the gate of the transistor T21.

The LD1 switching current driving circuit turns the laser diode LD1 on and off according to the image pattern data DATA1 to form an image. The LD1 switching current driving circuit includes a switch Sa, a transistor T22, and a switch current setting resistor Rsw that are connected in series; and an error amplifying circuit A22 the output terminal of which is connected to the gate of the transistor T22.

One input terminal (−) of the error amplifying circuit A21 is connected to the node between the transistor T21 and the bias current setting resistor Rbi; and one input terminal (−) of the error amplifying circuit A22 is connected to the node between the transistor T22 and the switch current setting resistor (Rsw).

A voltage stored in a capacitor C21 is input to the other input terminal (+) of the error amplifying circuit A21, and a voltage stored in a capacitor C22 is input to the other input terminal (+) of the error amplifying circuit A22.

Similarly, the drive current setting circuit B 204 sets a drive current for the laser diode LD2 and includes an LD2 bias current driving circuit and an LD2 switching current driving circuit.

The LD2 bias current driving circuit sets a drive current to be supplied to the laser diode LD2 during normal operations (e.g., when no image is being formed according to image pattern data). The LD2 bias current driving circuit includes a transistor T23 and a bias current setting resistor Rbi that are connected in series; and an error amplifying circuit A23 the output terminal of which is connected to the gate of the transistor T23.

The LD2 switching current driving circuit turns the laser diode LD2 on and off according to the image pattern data DATA2 to form an image. The LD2 switching current driving circuit includes a switch Sb, a transistor T24, and a switch current setting resistor Rsw that are connected in series; and an error amplifying circuit A24 the output terminal of which is connected to the gate of the transistor T24.

One input terminal (−) of the error amplifying circuit A23 is connected to the node between the transistor T23 and the bias current setting resistor Rbi; and one input terminal (−) of the error amplifying circuit A24 is connected to the node between the transistor T24 and the switch current setting resistor Rsw.

A voltage stored in a capacitor C23 is input to the other input terminal (+) of the error amplifying circuit A23, and a voltage stored in a capacitor C24 is input to the other input terminal (+) of the error amplifying circuit A24.

Reference voltages (Vref1-Vref4) input to a reference voltage selecting circuit 200 may be determined such that bias currents and switching currents for the laser diode LD1 and the laser diode LD2 are optimized under normal operating conditions.

Operations of the multi-beam laser light-intensity control circuit of this embodiment are described below.

A light-receiving element PD receives laser beams emitted from the laser diodes LD1 and LD2 and outputs feedback currents ID. An I/V conversion circuit 20A (corresponding to the PD control circuit (unit) of the first and second embodiments) converts the feedback currents ID into feedback voltages VD.

The feedback voltages VD from the I/V conversion circuit 20A and reference voltages selected by the reference voltage selecting circuit 200 are input to an error amplifying circuit (APCamp) A2 that is used commonly for multiple channels. In APC control circuits 1 through 4, switches S21 through S24 are controlled sequentially (i.e., by time sharing) according to signals APC1 through APC4 to store output voltages from the error amplifying circuit (APCamp) A2 in the corresponding capacitors C21 through C24.

The voltages stored in the capacitors C21 through C24 are input to the error amplifying circuits A21 through A24. Accordingly, the levels of drive currents for the laser diodes LD1 and LD2 are adjusted based on the levels of the voltages stored in the capacitors C21 through C24. This configuration makes it possible to increase the drive currents of the laser diodes LD1 and LD2 when their light intensities detected by the light-receiving element PD become lower than predetermined levels and to decrease the drive currents of the laser diodes LD1 and LD2 when their light intensities become higher than the predetermined levels.

According to the third embodiment, a multi-beam laser light-intensity control circuit includes a bias current driving circuit and a switching current driving circuit (in this case, the number of necessary hold circuits is "the number of laser diodes×2") for each laser diode. Still, however, only one error amplifying circuit is necessary in the APC control circuit 201 regardless of the number of laser diodes or the number of laser beams. Thus, the third embodiment makes it possible to reduce the mounting area (or the size) and the costs of a multi-beam laser light-intensity control circuit.

SECOND COMPARATIVE EXAMPLE

Figure 9:
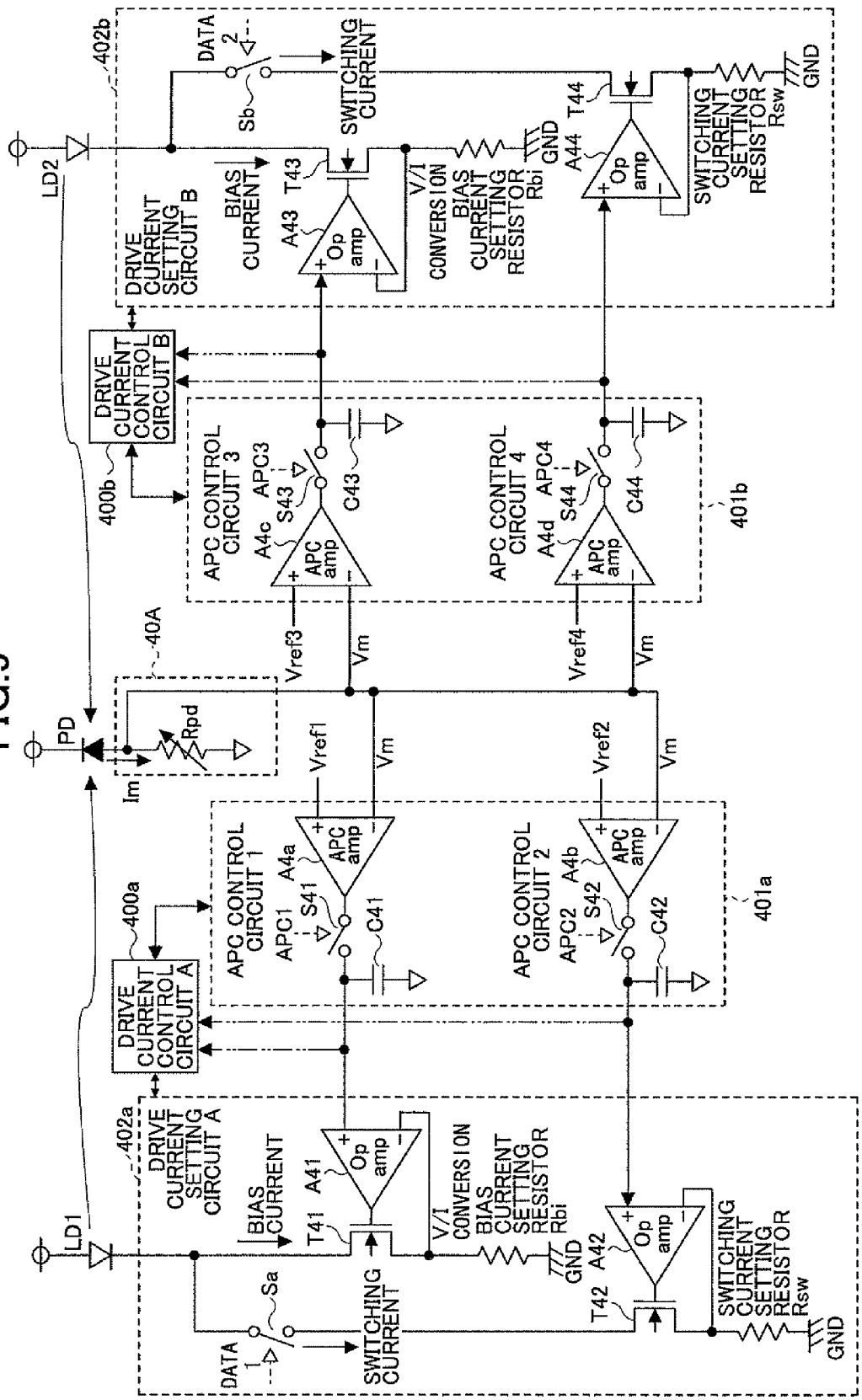
FIG. 9 is a circuit diagram of a multi-beam laser light-intensity control circuit of a second comparative example.

A second comparative example for comparison with the third embodiment is described below. FIG. 9 is a circuit diagram of a multi-beam laser light-intensity control circuit of the second comparative example.

The second comparative example shown in FIG. 9 is different from the third embodiment shown in FIG. 4 in that error amplifying circuits (A4a through A4d in FIG. 9) used for APC are provided for the bias current driving circuit and the switching current driving circuit provided for each laser diode or a laser beam. Except for this difference, the second comparative example is substantially the same as the third embodiment, and therefore detailed descriptions of the second comparative example is omitted here. Accordingly, the configuration of the second comparative example increases the mounting area (or the size) and the costs of a multi-beam laser light-intensity control circuit.

On the other hand, with the configuration of the third embodiment shown in FIG. 4, only one error amplifying circuit is necessary in the APC control circuit 201 regardless of the number of laser diodes or the number of laser beams. Thus, the third embodiment makes it possible to reduce the mounting area (or the size) and the costs of a multi-beam laser light-intensity control circuit.

Needless to say, a multi-beam laser light-intensity control circuit according to any one of the first through third embodiments may be used for an optical scanning apparatus such as a facsimile machine, a copier, or a scanner.

The present invention is not limited to the specifically disclosed embodiments, and variations and modifications may be made without departing from the scope of the present invention.

The present application is based on Japanese Priority Application No. 2009-180472, filed on Aug. 3, 2009, the entire contents of which are hereby incorporated herein by reference.

What is claimed is:

1. A multi-beam laser light-intensity control circuit, comprising:
   a plurality of laser diodes;
   a single light-receiving element configured to receive a laser beam emitted from each of the laser diodes and to output a current corresponding to a light intensity of the received laser beam; and
   an automatic power control circuit configured to automatically control output power of each of the laser diodes based on the current output from the light-receiving element,
   wherein the automatic power control circuit includes
      a current/voltage conversion unit configured to convert the current output from the light-receiving element into a voltage;
      a single error amplifying circuit provided for the laser diodes and configured to amplify a difference voltage between the voltage output from the current/voltage conversion unit and a predetermined reference voltage and to output the amplified difference voltage;
      storing circuits each configured to store the difference voltage output from the error amplifying circuit in association with a corresponding one of the laser diodes; and
      drive current generating units each configured to generate a drive current for driving the corresponding one of the laser diodes based on the difference voltage stored in a corresponding one of the storing circuits.

2. The multi-beam laser light-intensity control circuit as claimed in claim 1, wherein the error amplifying circuit is configured to amplify the difference voltage between the voltage output from the current/voltage conversion unit and one of reference voltages predetermined for the respective laser diodes.

3. The multi-beam laser light-intensity control circuit as claimed in claim 2, wherein
   each of the drive current generating units includes
   a bias current setting circuit configured to generate a bias current for the corresponding one of the laser diodes when no image is being formed according to image pattern data, and
   a switching current setting circuit configured to generate a switching current for turning on and off the drive current for the corresponding one of the laser diodes according to the image pattern data to form an image;
   the error amplifying unit is configured to amplify the difference voltage between the voltage output from the current/voltage conversion unit and one of a reference voltage for controlling the bias current flowing through the bias current setting circuit and a reference voltage for controlling the switching current flowing through the switching current setting circuit that are predetermined for each of the laser diodes; and
   each of the storing circuits is configured to store the difference voltage output from the error amplifying circuit in association with the bias current setting circuit or the switching current setting circuit provided for the corresponding one of the laser diodes.

4. The multi-beam laser light-intensity control circuit as claimed in claim 3, wherein
each of the bias current setting circuit and the switching current setting circuit includes a
transistor and a resistor connected in series to the corresponding one of the laser diodes; and
the transistor is controlled by the difference voltage output from a corresponding one of the storing circuits.

5. An optical scanning apparatus comprising the multi-beam laser light-intensity control circuit of claim 1.

6. An optical scanning apparatus comprising:
plural laser diodes;
a single light-receiving element configured to receive from each particular laser diode of the plural laser diodes, a laser beam emitted from the particular laser diode and output a current corresponding to a light intensity of the laser beam received from the particular laser diode; and
an automatic power control circuit that automatically controls, for said each particular laser diode amongst the plural laser diodes, output power of the particular laser diode based on the current corresponding to the light intensity of the laser beam received by the single light-receiving element from the particular laser diode, the automatic power control circuit including a current/voltage conversion unit configured to convert, for said each particular laser diode amongst the plural laser diodes, the current output from the light-receiving element for the particular laser diode, into a voltage;
a single error amplifying circuit provided for the plural laser diodes and configured to amplify, for said each particular laser diode amongst the plural laser diodes, a difference voltage between (i) the voltage output from the current/voltage conversion unit for the particular laser diode and (ii) a predetermined reference voltage and to output the amplified difference voltage;
storing circuits each configured to store the difference voltage output from the error amplifying circuit in association with the corresponding laser diode amongst the plural laser diodes; and
drive current generating units each configured to generate a drive current for driving the corresponding laser diode amongst the plural laser diodes based on the difference voltage stored in a corresponding storing circuit amongst the storing circuits.

* * * * *